United States Patent [19]

Chen

[11] Patent Number: 5,506,383

[45] Date of Patent: Apr. 9, 1996

[54] WAFER SCALE MULTI-CHIP MODULE

[75] Inventor: Yaw-Hwang Chen, Fort Collins, Colo.

[73] Assignee: Hewlett-Packard Company, Palo Alto, Calif.

[21] Appl. No.: 386,893

[22] Filed: Feb. 10, 1995

Related U.S. Application Data

[62] Division of Ser. No. 189,623, Feb. 1, 1994, Pat. No. 5,418,687.

[51] Int. Cl.$^6$ .......................... B23K 1/002; H01L 21/60; H05K 3/20
[52] U.S. Cl. .......................... 219/85.22; 427/96; 29/831; 29/832; 437/209; 437/902
[58] Field of Search .......................... 29/592.1, 831–832, 29/834–835, 854; 228/179.1, 180.1, 180.21; 219/85.13, 85.22, 91.2; 427/96–97; 437/209, 902

[56] References Cited

U.S. PATENT DOCUMENTS

| | | | |
|---|---|---|---|
| 4,544,989 | 10/1985 | Nakabu et al. | |
| 5,243,498 | 9/1993 | Scofield | 361/767 |
| 5,300,812 | 4/1994 | Lupinski et al. | 361/761 |
| 5,313,367 | 5/1994 | Ishiyama | 361/761 |

OTHER PUBLICATIONS

M. G. Sage, "Multichip Modules—The Hybrid for Wafer-Scale Integration," Hybrid Circuits, No. 21, Jan. 1990, pp. 36–38.
Cheng Wheling, Mark A. Beiley, and S. Simon Wong, "Membrane Multi–Chip Module Technology On Silicon," IEEE Multi–Chip Module Conference Proceedings Mar., 1993, Santa Cruz, Calif., pp. 69–73.
Harry F. Lockwood, "Hybrid Wafer Scale Optoelectronic Integration," SPIE vol. 1389–International Conference on Advances In Interconnection And Packaging, 1990, pp. 55—67.
David J. Pedder, "Interconnection Technologies For Multi-chip Assemblies (ITMA)–A UK Information Technology Engineering Directorate Hybrid Wafer Scale Project," IEEE International Conference On Wafer Scale Integration, San Francisco, Calif., 1993, pp. 95–107.
M. Burnus, H. Taddiken, H.–D. Hartmann, and T. Hillmann–Ruge, "Laserpersonalization Of Interconnection Arrays For Hybride ASIC's," IEEE International Conference On Wafer Scale Integration, 1993, San Francisco, Calif., 329–339.
Howard W. Markstein, "Multichip Modules Pursue Wafer Scale Perforamnce," Electronic Packaging & Production, Oct. 1994, pp. 40–45.
Dr. Alastair Trigg, "Silicon Hybrid Multichip Modules," Hybrid Circuit Technology, May 1991, pp. 44–50.
John K. Hagge, "Ultro–Reliable Packaging for Silicon–On–Silicon WSI," IEEE Transactions On Components, Hybrids, And Manufacturing Technology, vol. 12, No. 2, Jun. 1989, pp. 170–179.
Scott Westbrook, "Test Vehicle For MCM–D Interconnect Process Development," IEEE Multi–Chip Module Conference, Santa Cruz, Calif., Mar., 1993 pp. 106–110.
Terry Costlow, "Two Join MCM Market," Electronic Engineering Times, Jun. 7, 1993, p. 58.
Wolfgang Daum, William E. Burdick Jr., and Raymond A. Fillion, "Overlay High–Density Interconnect: A Chips–First Multichip Module Technology," IEEE Proceedings, Apr. 1993, pp. 23–29.

(List continued on next page.)

*Primary Examiner*—Bot L. Ledynh
*Attorney, Agent, or Firm*—Cynthia S. Baan

[57] ABSTRACT

A wafer scale multi-chip semiconductor module used to interconnect and house a plurality of integrated circuit chips. The wafer scale multi-chip semiconductor module has an interconnect network extending between the integrated circuit chips along the substrate of the semiconductor wafer module, which allows electrical access to the integrated circuit chips by means of electrically conductive bridge connections. The integrated circuit chips are placed in openings in the semiconductor wafer module, allowing for excellent planarity.

5 Claims, 7 Drawing Sheets

OTHER PUBLICATIONS

Paul D. Franzon and Rober J. Evans, "*A Multichip Module Design Process For Notebook Computers,*" IEEE Proceedings, Apr. 1993, pp. 41–49.

Ron Iscoff, "*Are MCMs The New Packaging Champ?,*" Semiconductor International, Dec. 1992, pp. 48–55.

Bill Blood, "*ASIC Design Methodology For Multichip Modules,*" Hybrid Circuit Technology, Dec. 1991, pp. 20–27.

Gail Lehman–Lamer, Douglas B. Hoy and Kathy M. Middo, "*New Multilayer Polyimide Technology Teams With Multilayer Ceramics To Form MultiChip Modules Hybrid Circuit Technology*", Oct. 1990, pp. 21–26.

L. M. Levinson, C. W. Eichelberger, R. J. Wojnarowski, and R. O. Carlson, "*High–Density Interconnects Using Laser Lithography,*" ISHM, 1988 Proceedings pp. 301–306.

Clive Maxfield and Don Kuk, "*A Multichip Module Primer–Does everybody understand MCMs but you?,*" Printed Circuit Design, Jun. 1992, pp. 17–23.

C. A. Neugebauer, "*Comparison of VLSI Packaging Approaches To Wafer Scale Integration,*" Corporate Research And Development General Electric Co., Schenectady, New York, pp. 462–467.

Hyman J. Levinstein, Charles J. Bartlett and Walter J. Bertram, Jr., "*Multi–Chip Packaging Technology For VLSI––Based Systems,*" and Clinton C. Chao, Kenneth D. Scholz, Jacques Leibovitz, Maria Cobarruviaz and Cheng C. Cheng, "*Multi–Layer Thin–Film Substrates For Multi–Chip Packaging,*" IEEE Log Number 8927118, Dec. 1988, pp. 472–478.

Krishna Shenai, "*Part VIII Multichip Packaging And Metallization Reliability and Albert J. Blodgett, Jr., Microelectronic Packaging,*" pp. 449–461.

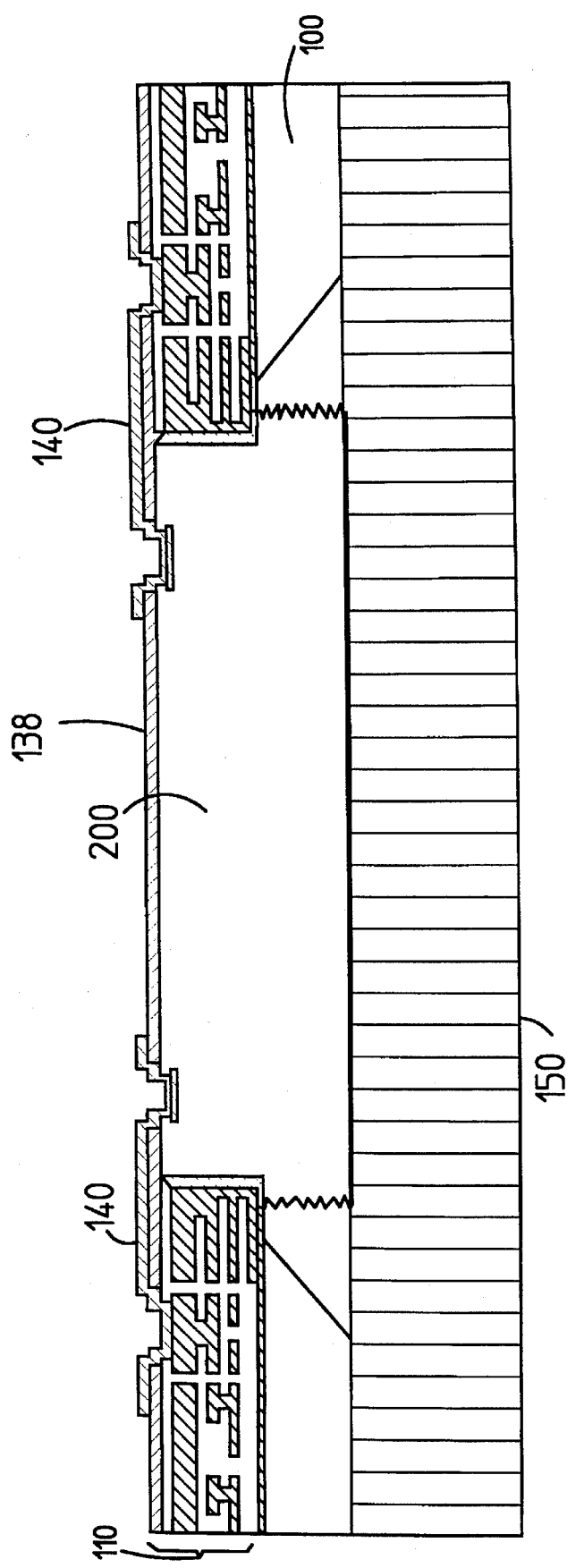

WAFER SCALE MULTI-CHIP MODULE

This application is a divisional of application Ser. No. 08/189,623 filed Feb. 1, 1994 U.S. Pat. No. 5,418,687.

FIELD OF THE INVENTION

The present invention relates generally to the field of semiconductor devices and the manufacturing method thereof and, more specifically, to the design and manufacturing of high density semiconductor devices. In particular, this invention pertains to multi-chip modules.

BACKGROUND OF THE INVENTION

The size, complexity, and speed of integrated circuits are increasing every year. At the same time, the reduction of size and weight is an extremely important goal, especially in applications such as aerospace, aviation, lap top computers, etc. And in the area of packaging, density translates directly into speed. Accordingly, the current trend is to house and interconnect multiple integrated circuits in the smallest area possible, often in a type of package referred to as a multi-chip module.

One type of multi-chip module utilizes solder bumps to attach integrated circuit die to a module substrate. Solder bumps are placed on the pads of the integrated circuit, the module, or both. The integrated circuit is then mated to the module substrate. A thermal cycle melts the solder and bonds the pad areas together. Generally, the module substrate has an interconnect network to route the integrated circuit's inputs and outputs to the rest of the system.

The solder bump technique has many advantages over other multi-chip module methods. However, the conventional solder bump approach does not address all packaging requirements. For example, since the solder bump connections are generally made between the under side of the integrated circuit die and the substrate, accurate placement is an issue. Also, it is difficult to test the individual integrated circuits for failures, once the integrated circuits are attached to the module. Even if individual defective integrated circuits are found, it is difficult to swap out defective integrated circuits for good ones.

Another aspect of multi-chip modules incorporating densely packed high power integrated circuits is that efficient heat dissipation is required. As integrated circuits are placed closer together, the power dissipation problem becomes aggravated. In the conventional solder bump attachment technique, the only contact the integrated circuits have with the module substrate is through the solder bumps. Yet, heat dissipation through the solder bump connections is not the best solution to the problem. For multi-chip modules with minimal heat dissipation requirements, thermal bumps can be added at the cost of active area or heat can be dissipated into the ambient via the back plane of the integrated circuit. However, for multi-chip modules with greater thermal dissipation requirements, complex attachments such as thermal conduction modules incorporating heat sinking or forced air are used, which increases the module complexity and cost.

Another recent approach to the size reduction goal is wafer scale integration in which many or all the integrated circuits necessary for a particular application are fabricated and interconnected on a single wafer. The problem with this approach is that numerous redundant integrated circuits must be designed into the wafer in order to accommodate failures. When the wafer is tested, bad die are disconnected and good die are connected into the circuit. Although this approach alleviates the need to remove bad die from a module and has better planarity, this is a very expensive solution, both in excess material cost and in excess size.

Accordingly, a solution to the size reduction goal for multi-chip integrated circuit packages is needed, which allows for easy placement of the integrated circuit die into the module, easy swapping of bad die for good die, and easy heat dissipation solutions, as well as optimum size reduction, and optimum module planarity.

SUMMARY OF THE INVENTION

It is an aspect of the present invention to provide a wafer scale multi-chip module that has optimum size reduction.

It is another aspect of the present invention to provide a wafer scale multi-chip module that permits adequate heat dissipation.

It is a further aspect of the present invention to provide a wafer scale multi-chip module that permits individual integrated circuit die to be readily replaced.

It is yet a further aspect of the present invention to provide a wafer scale multi-chip module that permits improved front and back-side planarity of said module.

It is yet a further aspect of the present invention to provide a wafer scale multi-chip module that permits controlled tolerance between the integrated circuit die and the module substrate.

The above and other aspects of the present invention are accomplished by providing a semiconductor wafer with precisely sized holes for the individual integrated circuit die to fit into and a prefabricated interconnect network between the integrated circuit die. Once the integrated circuit die are placed into the holes in the semiconductor wafer, bridges are connected between the inputs and outputs of the die and the interconnect network.

BRIEF DESCRIPTION OF THE DRAWINGS

The above and other objects, features, and advantages of the present invention will be better understood by reading the following more particular description of the invention, presented in conjunction with the following drawings, wherein:

FIG. 7 shows a cross sectional view of a portion of the wafer scale multi-chip module of the present invention with an optional heat sink attached to the back plane of the module.

DETAILED DESCRIPTION OF THE PRESENT INVENTION

Figure 1:
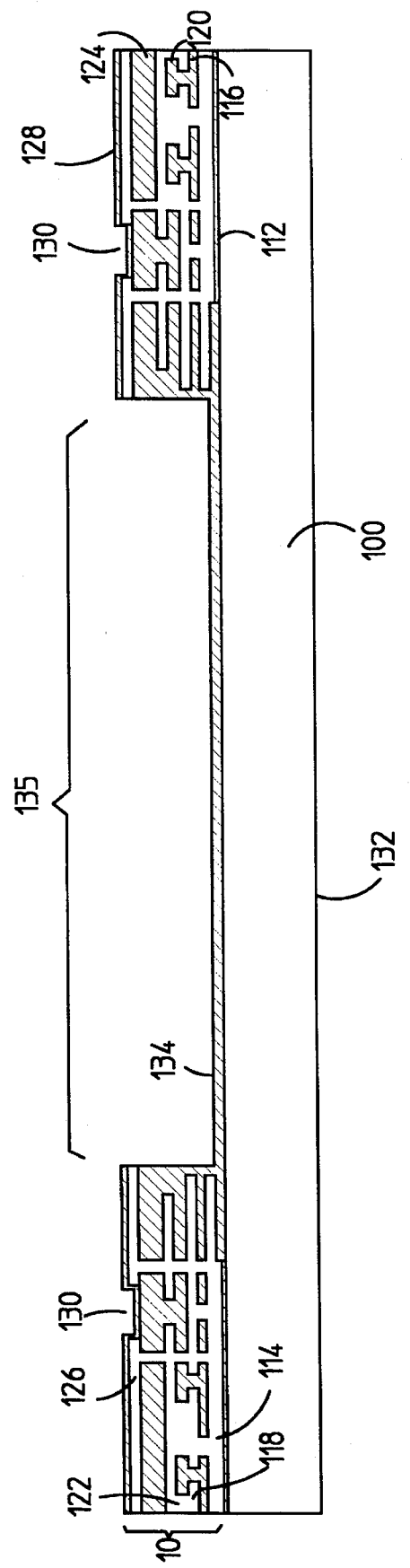
FIG. 1 shows a cross sectional view of a portion of the wafer scale multi-chip module of the present invention during fabrication after the interconnection network has been formed on the semiconductor wafer.
Figure 4:
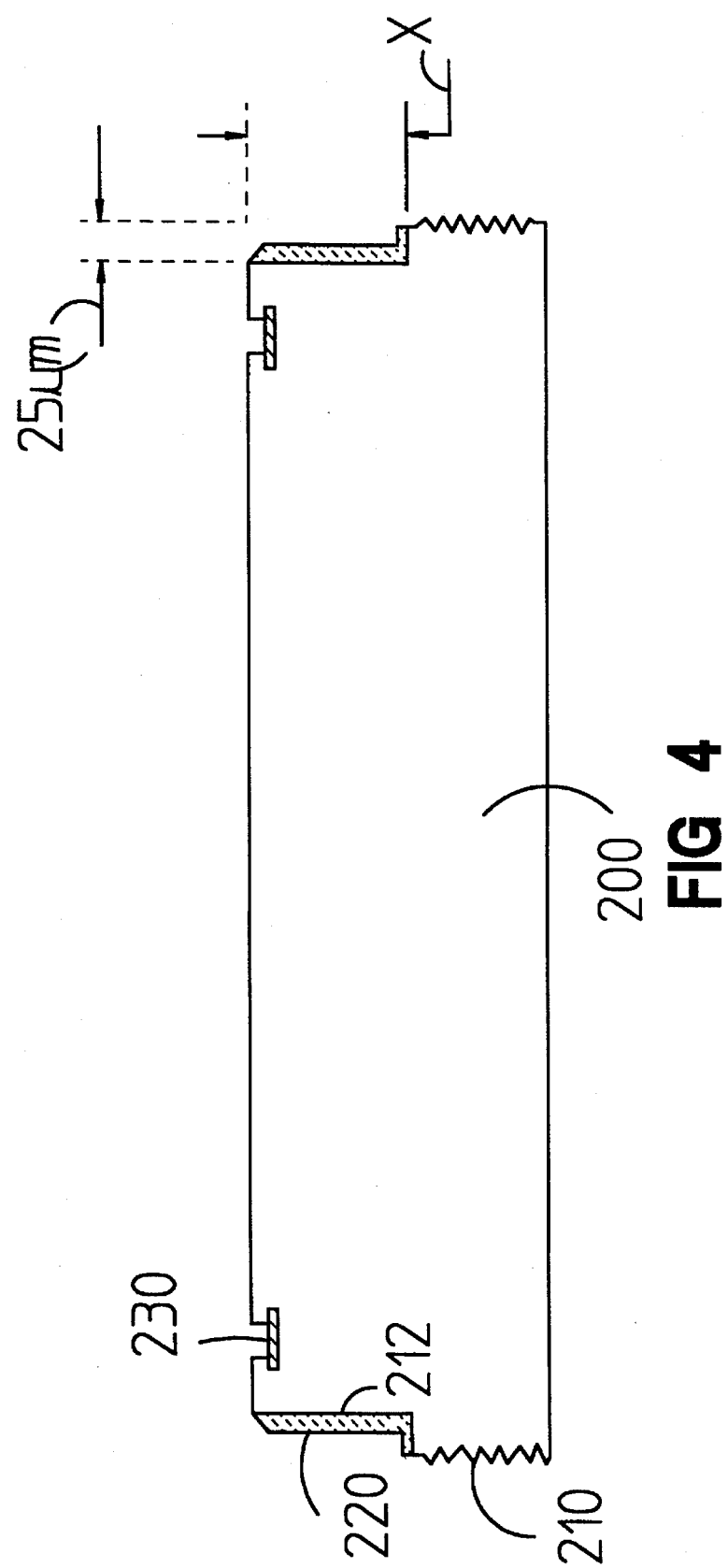
FIG. 4 shows a cross sectional view of a semiconductor chip that has been etched in preparation for placement into the wafer scale multi-chip module.

FIG. 1 shows a cross sectional view of a portion of the wafer scale multi-chip module of the present invention during fabrication after the multi-layer interconnect network 110 has been formed. Interconnect network 110 is formed by any known process. For example, ground plane 112 of platinum or platinum and copper may be sputtered onto the silicon substrate 100. Next a polyimide layer 114 of approximately 5 µm is spun onto the top surface of ground plane 112 and then patterned and etched. A chromium/copper/chromium (Cr/Cu/Cr) interconnect plane 116 of approximately 2 µm is sputtered onto the top surface of the polyimide layer 114 and then patterned and etched. The steps of the formation of polyimide and Cr/Cu/Cr layers are repeated to fabricate the number of multiple layers (114–126) of interconnections necessary for the intended circuit. The last layer of the interconnect network 110 is polyimide layer 126, which has vias 130 formed therein for connecting interconnect network 110 to a semiconductor chip 200 (FIG. 4). The interconnect 110 is formed in such a manner that where chips 200 are to be placed (openings 135), all interconnect layers are etched away during interconnect fabrication. Openings 135 in the interconnect 110 are just slightly larger than the size of the chip 200 plus 50 µm. The walls of interconnect network 110 along the openings 135 are substantially vertical.

Figure 2:
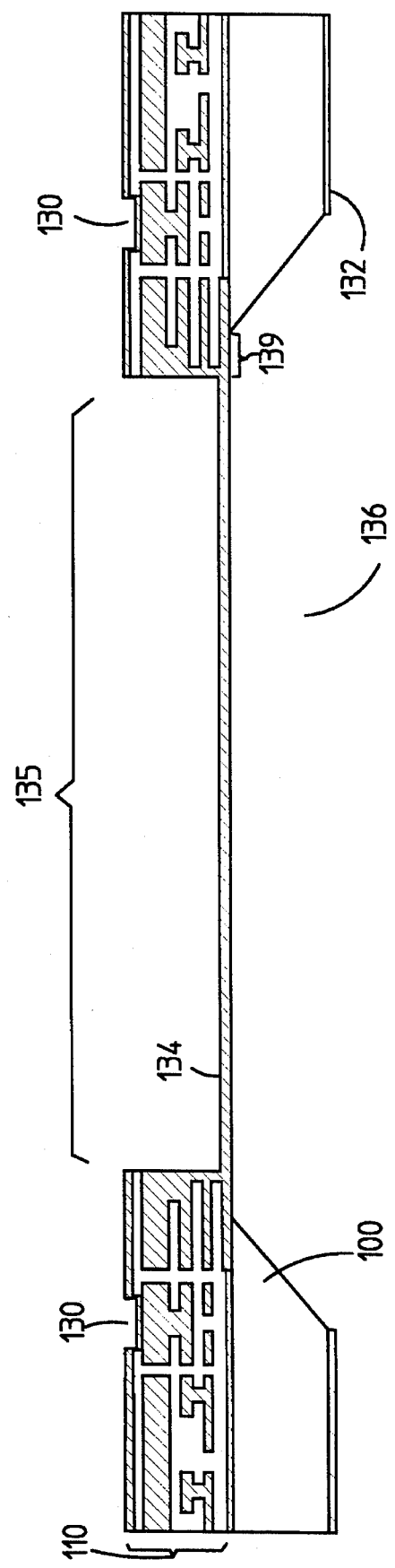
FIG. 2 shows a cross sectional view of a portion of the wafer scale multi-chip module of the present invention during fabrication after the semiconductor wafer has been etched.
Figure 3:
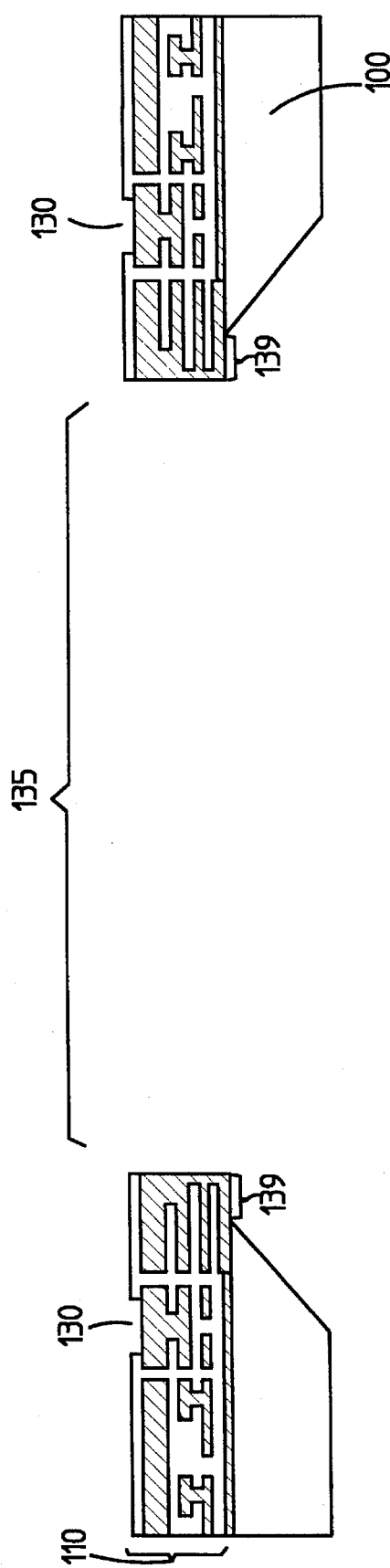
FIG. 3 shows a cross sectional view of a portion of the wafer scale multi-chip module of the present invention during fabrication after the platinum has been removed to allow placement of the semiconductor chip.

After the last layer of polyimide 126 is patterned, a layer of platinum is sputtered on both the front and back sides of the silicon wafer. The platinum 132 on the back side of the wafer is etched to serve as a mask for forming opening 136 (FIG. 2). Then a wet silicon etchant is used on the back side of wafer 100 until the ground plane 112 is reached (FIG. 2). This silicon etch will create a 45 degree slope from the top surface of the wafer module to the back surface of the wafer module, such that the back side opening is slightly wider than the front side opening. The opening should also reach the edge of the interconnect network, such that the interconnect network is slightly exposed from the backside of the wafer (by approximately 25 µm) in the opening in the wafer module at 139. All exposed platinum is then removed from the wafer by means of etching, which causes opening 137 to be formed in wafer 100 (FIG. 3).

FIG. 4 shows a silicon semiconductor chip 200 that has been separated, via any conventional scribe or saw method, from a chip fabrication wafer (not shown) at perimeter 210. Before chip 200 is separated from the chip fabrication wafer, an l-shaped groove 212 is etched along the top edge of chip 200. Groove 212 is approximately 25 µm wide, is a depth X that is equal to the depth of the interconnect network 110, and extends around the entire perimeter of chip 200. Groove 212 is etched in chip 200 in order to permit chip 200 to mate with wafer 100 at opening 135 (FIG. 1).

The mating of chip 200 with wafer 100 in this manner allows for a better tolerance between chip 200 and wafer 110, as etch lines can be more readily controlled than scribe lines. The density of chips 200 in a wafer module 100 is governed by the size of the chips plus the size of the interconnect network minus 50 µm. This is to be distinguished from the prior art in which the density of a module is governed by the size of the chips plus the size of the interconnect network plus any alignment tolerance factors.1

Figure 5:
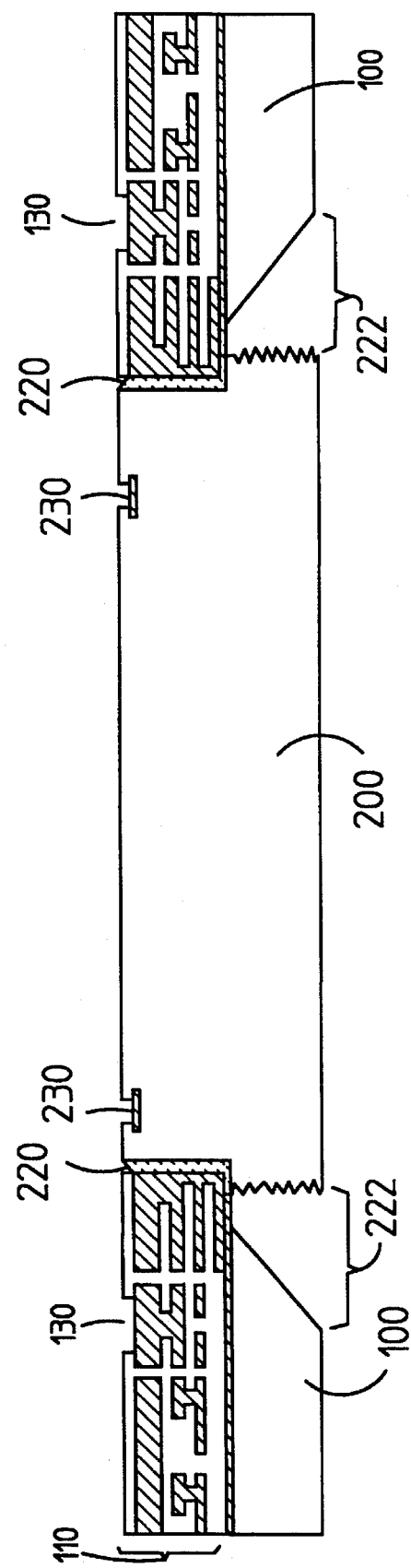
FIG. 5 shows a cross sectional view of a portion of the wafer scale multi-chip module of the present invention during fabrication after the integrated circuit die has been placed into the module and the solder has been reflowed.
Figure 6:
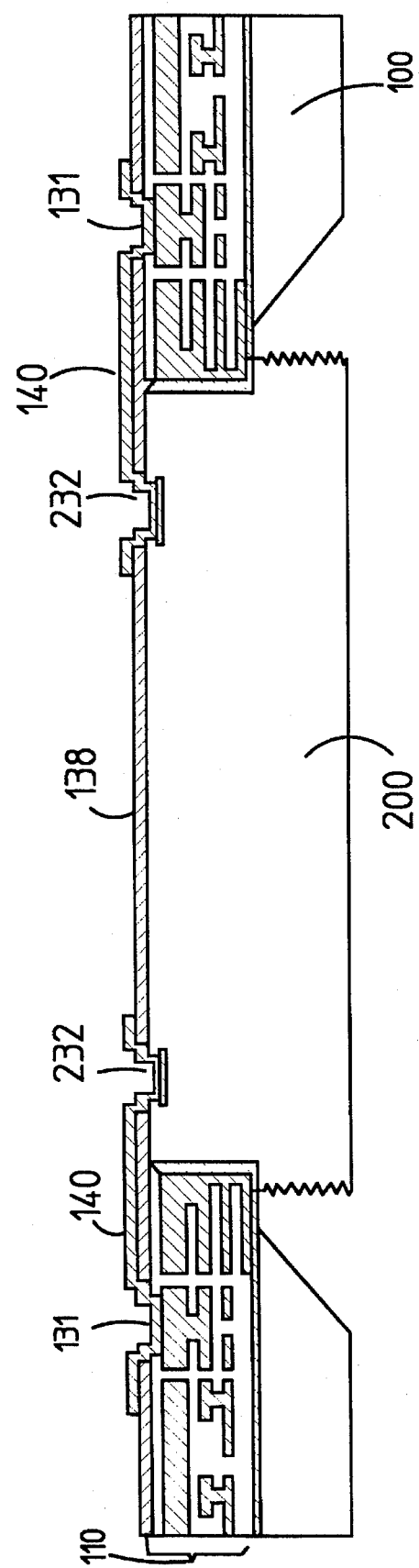
FIG. 6 shows a cross sectional view of a portion of the wafer scale multi-chip module of the present invention after the bridge between the inputs and the outputs of the integrated circuit die and the interconnection network of the module have been formed.

Before chip 200 is separated form the chip fabrication wafer, solder 220 is flowed in groove 212 along the top edge of chip 200. While chip 200 is mated with wafer 100 at opening 135, solder 220 is reflowed (FIG. 5). This reflow procedure is done with the module upside down, which permits the chip 200 to settle and planarize itself. A polyimide layer 138 of approximately 5 µm is then spun onto the top surface of chip 200 and wafer 100 (FIG. 6). Polyimide layer 138 is patterned and etched to form pad openings 232 in chip 200 and pad openings 131 in wafer module 100. A gold layer is then spun over the top surface of chip 200 and wafer module 100. The gold layer is masked and etched to form electrical connection bridges 140 between the pad openings 232 of chip 200 and the pad openings 131 of wafer module 100.

The present invention has many advantages over the prior art. For example, the mating of chip 200 to wafer module via opening 135 and groove 212 permits a tighter tolerance between the chip 200 and the wafer module 100 than conventional chip-module bonding methods. Accordingly, the method of the present invention saves acreage on wafer module 100, which allows room for more chips 200 or more interconnect 110. The present invention also permits easy removal and replacement of any bad chips by simply removing electrical connection bridges 140 and polyimide film 138 from the top of the wafer 100 and chip 200.

The present invention further permits a final wafer module that is substantially planar at both the top and bottom surfaces and substantially thinner than other multi-chip modules with a vertical height substantially equivalent to the height of a single chip 200, approximately 625 µm. The advantage of back planarity is that an optional heat sink 150 can be added to the back of the wafer module 100 (FIG. 7). Another advantage of the present invention is that the chip 200 and the wafer 100 are comprised of substantially the same material, and therefore, have substantially the same coefficient of expansion, which helps to alleviate module, chip and interconnect damage due to uneven thermal stress. Another means of alleviating thermal stress is to fill openings 222 between the semiconductor chip 200 and the wafer 100 with a silicon epoxy type substance. The multi-chip module can be connected to the rest of the system via any known or later developed multi-chip module interface means. One approach anticipated by the inventor is to use the heat sink as an edge connector.

The foregoing description of the invention has been presented for purposes of illustration and description. It is not intended to be exhaustive or to limit the invention to the precise embodiment disclosed, and other modifications and variations may be possible in light of the above teachings. For example, the chip 200 and the semiconductor module 100 could both be comprised of any conventional semiconductor material, such as gallium arsenide, rather than silicon. Also, the interconnect network 110 could consist of passive elements, such as resistors, inductors, etc., rather than just interconnect.

The embodiment was chosen and described in order to best explain the principles of the invention and its practical application to thereby enable others skilled in the art to best utilize the invention in various embodiments and modifications as are suited to the particular use contemplated. It is intended that the appended claims be construed to include other alternative embodiments of the invention except insofar as limited by the prior art.

What is claimed is:

1. A method of manufacturing a wafer scale multi-chip module comprising the following steps:

(a) forming a semiconductor wafer substrate, said semiconductor substrate having a top surface and a bottom surface;

(b) forming an electrically conductive interconnect network on said top surface of said semiconductor wafer substrate, said interconnect network having a plurality of openings with substantially vertical walls where semiconductor chips are to be placed;

(c) forming contact pads on a top surface of said interconnect network;

(d) forming a plurality of openings in said semiconductor wafer substrate corresponding to said openings in said interconnect network, said plurality of openings in said semiconductor wafer substrate being slightly larger than said openings in said interconnect network;

(e) forming a plurality of integrated circuit chips, each of said plurality of integrated circuit chips having a top surface and a bottom surface;

(f) forming contact pads on said top surface of each of said integrated circuit chips corresponding to inputs and outputs of said integrated circuit chips;

(g) forming a groove along the perimeter of said top surface of each of said integrated circuit chips, said groove of each of said plurality of integrated circuit chips being slightly smaller than its corresponding opening in said interconnect network, the perimeter of each of said plurality of integrated circuit chips being slightly larger than its corresponding opening in said interconnect network;

(h) flowing solder into said groove along the perimeter of said top surface of each of said plurality of integrated circuit chips;

(i) mating each of said plurality of integrated circuit chips with its corresponding opening in said semiconductor wafer such that said top surface of each of said integrated circuit chips is substantially planar with said top surface of said interconnect network and said bottom surface of each of said integrated circuit chips is substantially planar with said bottom surface of said semiconductor wafer;

(j) reflowing said solder between said groove of each of said integrated circuit chips and said interconnect network;

(k) forming a passivation layer on said top surface of said interconnect network and said top surface of said interconnect network and said top surface of each of said integrated circuit chips;

(l) forming contact pad vias in said passivation layer corresponding to said contact pads of said interconnect network and said contact pads of each of said integrated circuit chips; and (m) forming a conductive bridge between contact pads on said interconnect network and corresponding contact pads on each of said integrated circuit chips.

2. The method of manufacturing a wafer scale multi-chip module according to the steps of claim 1 comprising the further step of:

(n) forming a heat sink on the bottom surface of said semiconductor wafer and the bottom surface of each of said integrated circuit chips.

3. The method of manufacturing a wafer scale multi-chip module according to the steps of claim 1 wherein said semiconductor wafer and said plurality of integrated circuit chips are comprised substantially of silicon.

4. The method of manufacturing a wafer scale multi-chip module according to the steps of claim 1 wherein said plurality of openings in said semiconductor wafer have walls with 45 degree angles between said top surface of said semiconductor wafer and said bottom surface of said semiconductor wafer such that resulting openings at said bottom surface of said semiconductor wafer are slightly wider than resulting openings at said top side of said semiconductor wafer.

5. The method of manufacturing a wafer scale multi-chip module according to the steps of claim 1 comprising the further step of:

(n) filling any gap between said plurality of integrated circuit chips and said semiconductor wafer substrate with a silicon epoxy type substance in order to enhance module strength.

\* \* \* \* \*